(12) United States Patent
Alzaher

(10) Patent No.: US 9,184,729 B2
(45) Date of Patent: Nov. 10, 2015

(54) RECONFIGURABLE NTH-ORDER FILTER

(71) Applicants: KING FAHD UNIVERSITY OF PETROLEUM AND MINERALS, Dhahran (SA); KING ABDULAZIZ CITY FOR SCIENCE AND TECHNOLOGY, Riyadh (SA)

(72) Inventor: Hussain Alzaher, Dhahran (SA)

(73) Assignees: KING FAHD UNIVERSITY OF PETROLEUM AND MINERALS, Dhahran (SA); KING ABDULAZIZ CITY FOR SCIENCE AND TECHNOLOGY, Riyadh (SA)

( * ) Notice: Subject to any disclaimer, the term of this patent is extended or adjusted under 35 U.S.C. 154(b) by 150 days.

(21) Appl. No.: 14/197,733

(22) Filed: Mar. 5, 2014

(65) Prior Publication Data
US 2015/0256148 A1    Sep. 10, 2015

(51) Int. Cl.
H03K 5/00    (2006.01)
H03H 11/04   (2006.01)

(52) U.S. Cl.
CPC .......... H03H 11/11 (2013.01); H03H 11/0405 (2013.01)

(58) Field of Classification Search
USPC ......................................................... 327/553
See application file for complete search history.

(56) References Cited

U.S. PATENT DOCUMENTS

| | | | |
|---|---|---|---|
| 5,124,666 A | 6/1992 | Liu et al. | |
| 5,594,390 A | 1/1997 | Holzer | |
| 7,183,851 B2 | 2/2007 | Song | |
| 8,132,143 B2 | 3/2012 | Chang et al. | |
| 8,264,289 B2 | 9/2012 | Chang et al. | |
| 2005/0134409 A1* | 6/2005 | Gandhi | H03F 1/34 333/217 |
| 2010/0005430 A1* | 1/2010 | Chang | G06F 17/505 716/103 |
| 2010/0264996 A1* | 10/2010 | Chang | H03B 27/00 331/137 |
| 2011/0316628 A1* | 12/2011 | Chang | H03F 3/211 330/252 |

FOREIGN PATENT DOCUMENTS

TW    M368975 U1    11/2009

OTHER PUBLICATIONS

Alzaher, H., Tasadduq, N., Al-Ees, O., Al-Ammari, F., "A complementary metal-oxide semiconductor digitally programmable current conveyor," International Journal of Circuit Theory and Applications, vol. 41, pp. 69-81.

* cited by examiner

Primary Examiner — Lincoln Donovan
Assistant Examiner — Patrick Chen
(74) Attorney, Agent, or Firm — Richard C. Litman

(57) ABSTRACT

The reconfigurable Nth-order filter includes a CCII adopting active current division networks for implementing the proposed filter. This digitally programmable second generation current conveyor leads to wide control of filter coefficients for reconfiguration of the filter. Programmability characteristics are demonstrated through experimental results obtained from integrated circuit chips fabricated in a 0.18 μm CMOS process.

16 Claims, 4 Drawing Sheets

RECONFIGURABLE NTH-ORDER FILTER

BACKGROUND OF THE INVENTION

1. Field of the Invention

The present invention relates to integrated circuit filters, and particularly to a reconfigurable Nth-order integrated circuit filter.

2. Description of the Related Art

The second generation current conveyor (CCII) was used to realize several high-order filters. Some of these filters, however, have a single output, and hence modifying the filter type would require changes in the hardware. In addition, the absence of a programmability feature of the classical CCII hinders the use of most of these filters in integrated circuit (IC) applications. Available filters adopting electronically programmed CCII are associated with limited tuning range.

Thus, a reconfigurable Nth-order filter solving the aforementioned problems is desired.

SUMMARY OF THE INVENTION

The present reconfigurable Nth-order filter includes a second generation current conveyor (CCII) adopting active current division networks (CDNs) for implementing the present filter. A second generation current conveyer leads to wide control of filter coefficients for reconfiguration of the filter. Programmability characteristics are demonstrated through experimental results obtained from integrated circuit chips fabricated in a 0.18 μm CMOS process.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The reconfigurable Nth-order filter includes a second generation current conveyor (CCII) adopting active current division networks for implementing the present filter. The CCII leads to wide control of filter coefficients for reconfiguration of the filter. Programmability characteristics are demonstrated through experimental results obtained from integrated circuit chips fabricated in a 0.18 μm CMOS process. The terminal characteristics of a CCII can be described as follows: $I_y=0$, $V_x=V_y$, and $I_z=\pm I_x$ where the positive and negative signs denote CCII+ ($I_x$ and $I_z$ have same direction) and CCII−, respectively. The following points should be observed in order to realize filters with independent coefficients. First, it can be seen that distributing the inputs or summing desired outputs using active elements with programmable gains $a_0$ through $a_n$ inherently result in filters with independent coefficients of N(s). Second, it can be seen that these topologies result in independent tuning of D(s) coefficients if programmable active elements are used to realize the feedback factors ($b_0$ through $b_n-1$). With the help of known filter topologies, voltage mode (VM) and current mode (CM) reconfigurable Nth-order filters (RNOFs) based on CCII can be developed. Dual- or multi-output CM active devices are often utilized to reduce the number of active elements.

Figure 2:
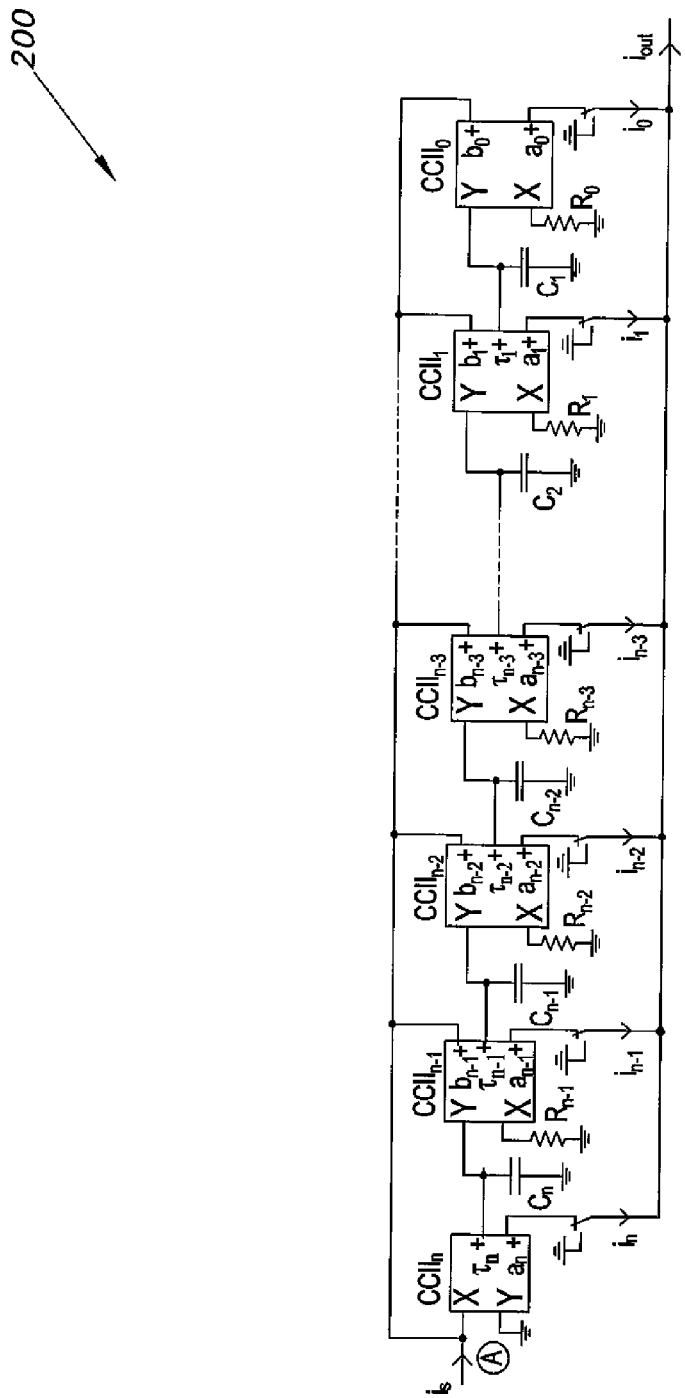
FIG. 2 shows the filter topology in which the widely programmable multi-outputs CCII of FIG. 1 is used according to the present invention.

A single CCII can be utilized to efficiently develop the integrator such that the feedback factor and output signals can be realized using the same device as the CM RNOF based on multi-output CCII 200, shown in FIG. 2.

This topology is adopted for CM signals since it is more efficient. A similar topology based on OTAs was developed in prior art current-mode high-order operational transconductance amplifier-capacitor (OTA-C) filters.

The transfer function (TF) of a general Nth-order filter (NOF) response can be expressed as:

$$T(s) = \frac{N(s)}{D(s)} = \frac{a_n s^n + a_{n-1} s^{n-1} + \ldots + a_1 s + a_0}{s^n + b_{n-1} s^{n-1} + \ldots + b_1 s + b_0} \quad (1)$$

where $a_0$ through $a_n$, are real numbers, and $b_0$ through $b_{n-1}$ are positive real numbers.

The second-generation current conveyor (CCII) is an essential building block for current mode (CM) processing. A reconfigurable Nth-order filter (RNOF) is a versatile filter that can be flexibly used to realize any Nth-order filter function without hardware changes. Hence, the RNOF serves a wide range of applications. Such filters are core parts of systems utilizing reconfigurable, e.g., field-programmable analog arrays. The present invention uses CCII in the design of RNOF.

Integrated circuit applications require filters to be associated with programmable parameters to adjust the filter frequency response compensating for components, process and temperature variations. The nature of RNOF demands even broader programmability features to accommodate wide range of selectivity requirements. In this regard, NOF filters can be classified based on their TFs coefficients into programmable or not programmable designs. Also, it is important to further classify the programmable filters as those with orthogonally or independently tuned parameters. Independent tuning of the RNOF coefficients allows adjusting one parameter (e.g. accommodating different bandwidths) but also changing the filter type (e.g. low-to-bandpass), and modifying the overall response (e.g. Butterworth (BT) to Chebyshev).

Traditional CCII, however, does not exhibit programmability feature obstructing its utilization in integrated VLSI applications involving complete systems on chip.

Integrator based filter topologies provide all functions simultaneously with possible independent tuning characteristics. They adopt either distributed inputs (DIs) or summed outputs (SOs) topologies to generate various N(s) terms. In practice, there could be two different circuit realizations these filters based on the availability of the s″ function of N(s) from the core circuit. The circuits without s″ term are often canonic in the sense that n devices are required to realize the n integrators. In such cases, s″ is often obtained through subtracting various outputs from the input signal results in a TF with several matching conditions for realizing the $s^n$ function. While there are various known combinations utilizing CCII none show the advantages gained from the configuration developed in the present widely programmable multi-outputs CCII 100 shown in FIG. 1. This configuration includes a CCII 102 having two outputs which are connected to $1^{st}$ and $2^{nd}$ current division networks (CDNs) 106 and 104, respectively. CDN 106 is connected to a digitally controlled current follower (DCCF) 108 while CDN 104 is connected to a corresponding DCCF 110. CDN 106 has a digital $\beta_b$, control input. CDN 106's corresponding DCCF 108 has a digital $\alpha_b$ control input. Similarly, CDN 104 has a digital $\beta_a$ control input. CDN 104's corresponding DCCF 110 has a digital $\alpha_a$ control input. The switches involved in the design of the CDN and DCCF are original parts of these devices and hence do not contribute converted to voltage signals using passive resistors of 1 kΩ. A VB is also used to drive the output terminal. Equal resistors ($R_0 = R_1 = R_2 = R_3$) of 159 kΩ and equal capacitors ($C_0 = C_1 = C_2 = C_3$) of 1 pF are used. These values lead to nominal pole frequency ($f_o$) of approximately 1 MHz. With eight-bit CDN, β can be adjusted from 0 to 0.996 whereas α can be changed from 1.004 to 256. First, CDNs are programmed to realize lowpass BT response with minimum pole frequency. This is achieved by selecting the lowpass output through setting $\beta_{a1}$ through $\beta_{a4}$ to zero. The lowest pole frequency of approximately 250 kHz is obtained by setting $\beta_{b0}\alpha_{b0}$ to 0.0039 while the other corresponding values of $\beta_b\alpha_b$ and $\beta_{a0}\alpha_{a0}$ are given in Table 1. The table shows the required theoretical values and the closest available digital word.

TABLE 1

Various settings to achieve the desired responses

| Filter Type | | | | | |
|---|---|---|---|---|---|
| BT (250 KHz) | $b_0$ = 0.0039 | $b_1$ = 0.0406 | $b_2$ = 0.2126 | $b_3$ = 0.6521 | $a_0$ = 0.0039 |
| Closest | $\beta_{b0}$ = 00000001 | $\beta_{b1}$ = 00001010 | $\beta_{b2}$ = 00110111 | $\beta_{b3}$ = 10100111 | $\beta_{a0}$ = 00000001 |
| Digital | $\alpha_{b0}$ = 11111111 | $\alpha_{b1}$ = 11111111 | $\alpha_{b2}$ = 11111111 | $\alpha_{b3}$ = 11111111 | $\alpha_{a0}$ = 11111111 |
| BT (4 MHz) | $b_0$ = 256 | $b_1$ = 10.44 | $b_2$ = 54.52 | $b_3$ = 166.8 | $a_0$ = 256 |
| Closest | $\beta_{b0}$ = 11111111 | $\beta_{b1}$ = 11111111 | $\beta_{b2}$ = 11111111 | $\beta_{b3}$ = 11111111 | $\beta_{a0}$ = 11111111 |
| Digital | $\alpha_{b0}$ = 00000001 | $\alpha_{b1}$ = 00001010 | $\alpha_{b2}$ = 00110111 | $\alpha_{b3}$ = 10100111 | $\alpha_{a0}$ = 00000001 |
| BT (1 MHz) | $b_0$ = 1 | $b_1$ = 2.613 | $b_2$ = 3.414 | $b_3$ = 2.613 | $a_0$ = 1 |
| Closest | $\beta_{b0}$ = 11111111 | $\beta_{b1}$ = 11111111 | $\beta_{b2}$ = 11111111 | $\beta_{b3}$ = 11111111 | $\beta_{a0}$ = 11111111 |
| Digital | $\alpha_{b0}$ = 11111111 | $\alpha_{b1}$ = 01011110 | $\alpha_{b2}$ = 01001011 | $\alpha_{b3}$ = 01011110 | $\alpha_{a0}$ = 11111111 | nonlinearity. This widely programmable multi-outputs CCII 100 is used in the filter topology 200 shown in FIG. 2. The resultant transfer functions can be expressed as:

$$\frac{i_m(s)}{i_s(s)} = \frac{s^m \beta_{am}\alpha_{am} s^i \Pi_{i=m}^{n-1} \frac{1}{C_{i+1}R_i}}{s^n + \Sigma_{i=0}^{n-1} \beta_{bi}\alpha_{bi} s^i \Pi_{j=i}^{n-1} \frac{1}{C_{j+1}R_j}}, \quad (2)$$

for m=0 to n−1, $$\frac{i_n(s)}{i_s(s)} = \frac{s^n \beta_{an}\alpha_{an}}{s^n + \Sigma_{i=0}^{n-1} \beta_{bi}\alpha_{bi} s^i \Pi_{j=i}^{n-1} \frac{1}{C_{j+1}R_j}}. \quad (3)$$

Clearly, the coefficients of D(s) and N(s) (from equation (1)) can be independently adjusted through various $\beta_b\alpha_b$ and $\beta_a\alpha_a$, respectively, of equations (2) and (3).

Figure 1:
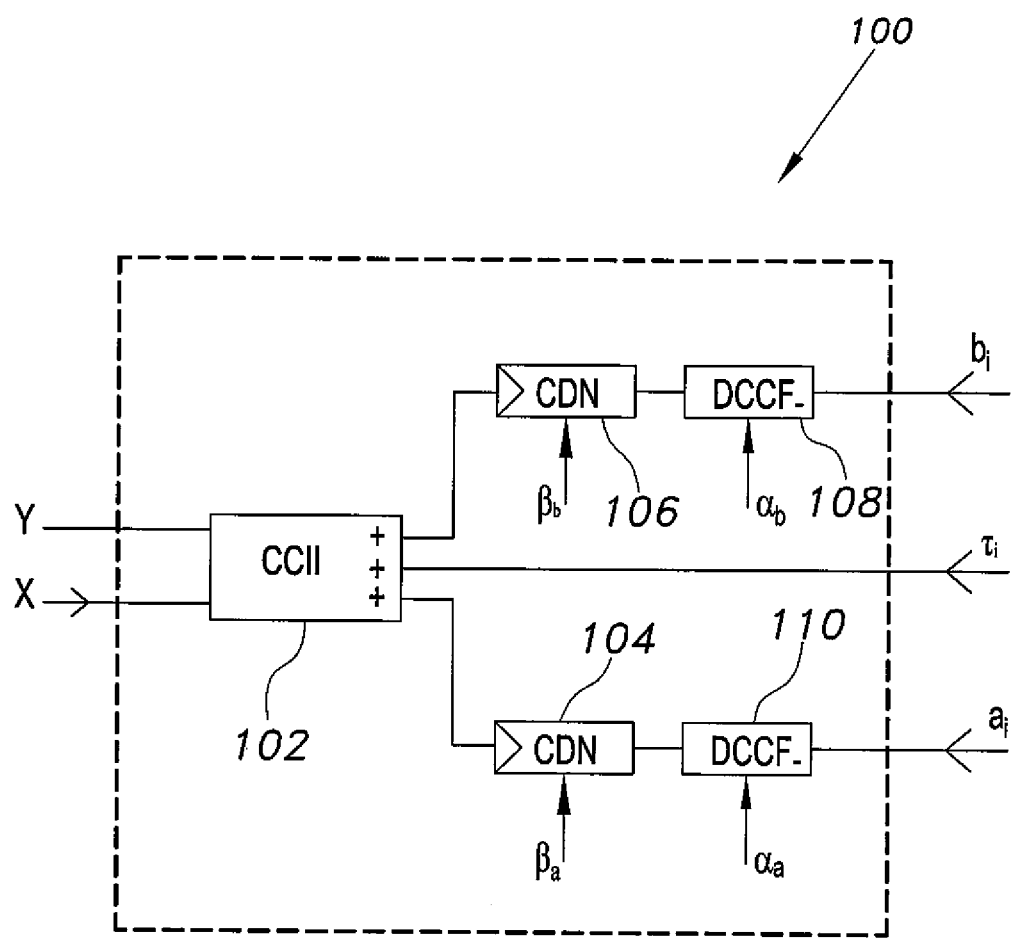
FIG. 1 is a widely programmable multi-outputs CCII according to the present invention.
Figure 3:
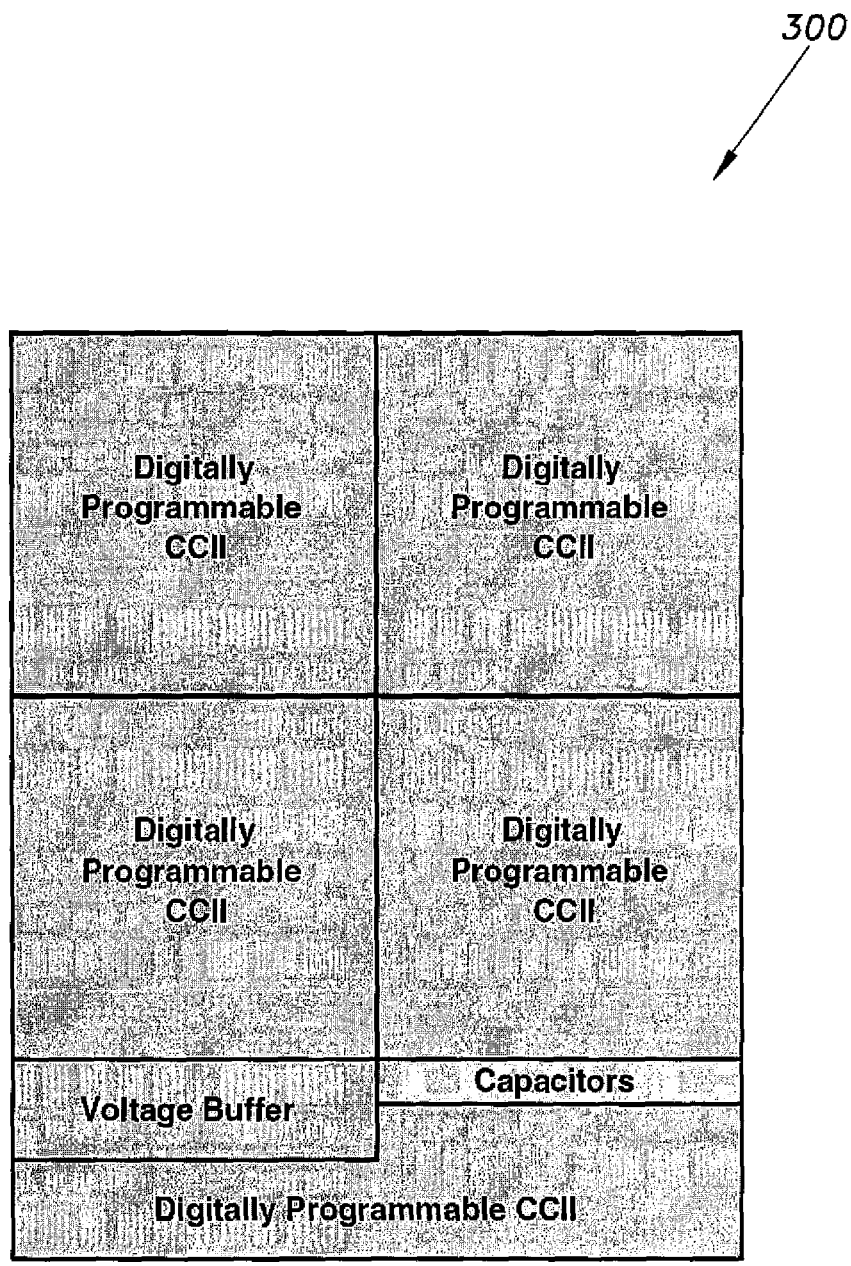
FIG. 3 is a pictorial representation of a die photograph showing component layout of the filter according to the present invention.

The 4th-order filter 200 obtained from the topology of FIG. 2 includes a cascade of the widely programmable multi outputs CCII circuit 100 shown in FIG. 1 and has been fabricated in a 0.18 μm N-well CMOS process. Die photograph 300 of the filter 200 composed with widely programmable multi-output CCII 100 is shown in FIG. 3. The voltage buffer (VB) and DCCF are utilized to realize the widely programmable CCII of FIG. 1. Throughout testing, the supply voltages were set to ±0.9 V and the currents of the CCII were $I_B$=20 $I_A$ and $I_{SB}$=5 $I_A$. The respective standby currents of a CCII with three outputs and the DCCF are approximately $3I_B + 6I_{SB}$ and $3I_B + 4I_{SB}$. Since the other CCIIs and DCCFs share the same $I_B$ and $I_{SB}$, each of these CCII and DCCF is biased with $2I_B + 5I_{SB}$ and $2I_B + 3I_{SB}$, respectively.

Figure 4:
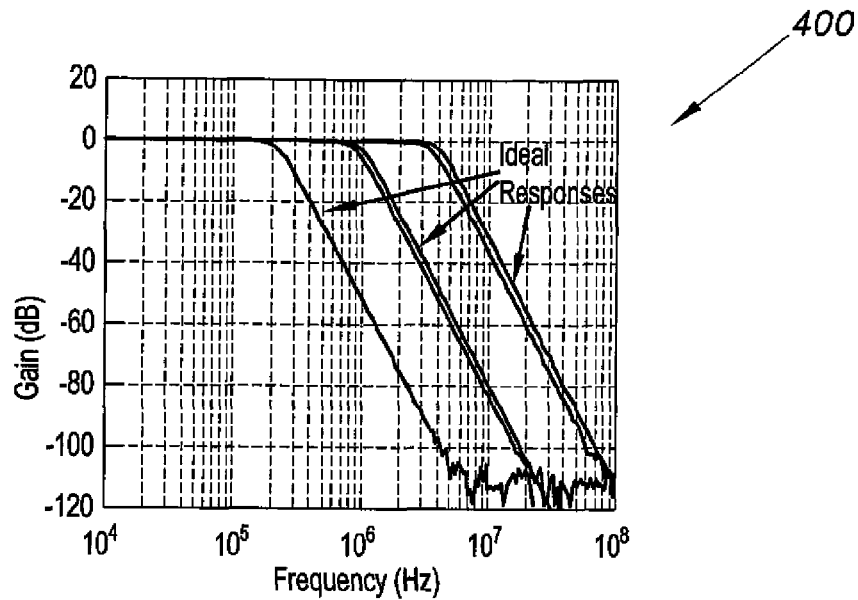
FIG. 4 is a pictorial representation of a die photograph showing component layout of the filter according to the present invention.

The corresponding total power consumption of the filter is approximately 1.55 mW. The input- and output currents are Then, the pole frequency was varied to its maximum value of 4 MHz by setting $\beta_{b0}\alpha_{b0}$ to 256. The corresponding values for other $\beta_b\alpha_b$ and $\beta_{a0}\alpha_{a0}$ preserving the BT response and same gain are given in Table 1. Next, the pole frequency was set to an arbitrary value of 1 MHz through programming $\beta_b\alpha_b$ and $\beta_{a0}\alpha_{a0}$ according to the values given in Table 1. The obtained measurement results demonstrating pole frequency adjustments are shown in plot 400 of FIG. 4. After that, the filter was reconfigured to realize bandpass and highpass responses by selecting the desired output signals.

Figure 5:
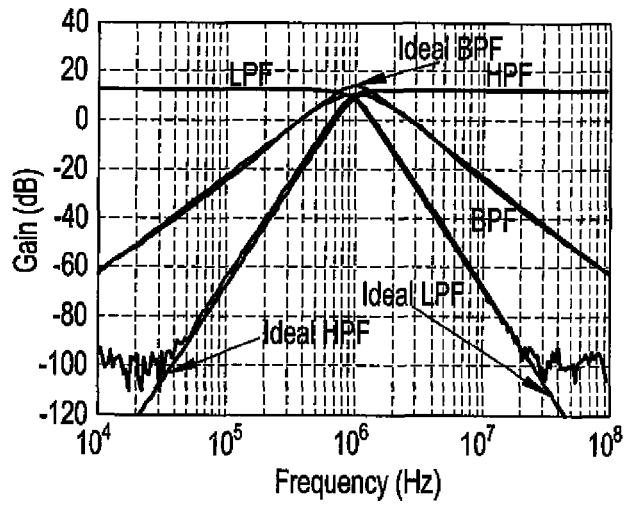
FIG. 5 is a pictorial representation of a die photograph showing component layout of the filter according to the present invention.

The bandpass response is obtained by setting $\beta_{a0}$, $\beta_{a1}$, $\beta_{a3}$, and $\beta_{a4}$ to zero while the highpass response is realized by making $\beta_{a0}$, $\beta_{a1}$, $\beta_{a2}$, and $\beta_{a3}$ equal to zero. Also, gain adjustments are demonstrated by increasing the gain to 12 dB as shown in plot 500 of FIG. 5.

The linearity of the filter was determined by finding the input third-order intercept point (IIP3) determined by performing several intermodulation (IM3) tests using 800 and 900 kHz signals. IIP3 estimation for in-band signals measured at the LPF output is found to be approximately 28 dBm (referenced to 50Ω). The output noise root spectral density for the LPF at gain of 12 dB was approximately 365 nV/Hz$^{1/2}$ over the passband. Thus, the total in-band noise for the LPF is calculated to be less than −68 dBm over bandwidth of 1 MHz. These values correspond with in-band spurious-free dynamic range of 64 dB.

The number of active devices can be reduced by using multi-output devices. But that approach traditionally leads to losing the programmability feature of N(s) and/or D(s) coefficients. In order to promote programmability feature, devices having different current gains would be required. The present reconfigurable Nth-order filter adopts two CDNs in the design of digitally programmable CCII to provide wide tuning range suitable for a field-programmable analog array (FPAA). In general, the available solutions provide simulation results. It is clear that the present filter comprised of CCII circuitry 100 cascaded in the topology of CM RNOF 200 would provide improved performances due to significant reduction in the number of active devices and passive resistors. The present reconfigurable Nth-order filter would require n+1 CCM and 2n+1 CAs (DCCFs) compared with 3n–2 CCIIs and CAs for prior art designs. The present reconfigurable Nth-order filter exhibits a wide tuning range and offers advantages which are crucial for FPAA applications. The advantages of the present reconfigurable Nth-order filter are supported by experimental results obtained from 0.18 μm CMOS process.

It is to be understood that the present invention is not limited to the embodiments described above, but encompasses any and all embodiments within the scope of the following claims.

I claim:
1. A reconfigurable Nth-order filter, comprising:
a filter stage which includes a second generation current conveyor (CCII) having a y input, an x input, first, second, and third current sense non-inverting outputs, for all stages except a first of said filter stage, second current sense non-inverting output connected to an ungrounded lead of a capacitor portion of a passive circuit having a time constant $\tau_i$;
the filter stage further including a first current division network (CDN) having an analog input, an analog output, and a digital control input $\beta_b$, the first current sense non-inverting CCII output being connected to the first CDN analog input;
the filter stage further including a first digitally controlled current follower (DCCF) having an input, a digital control input $\alpha_b$, and for all stages except a last said filter stage an inverting output connected to a current source $b_i$, output of the first CDN being connected to the first DCCF input;
the filter stage further including a second CDN having an analog input, an analog output, and a digital control input $\beta_a$, the third current sense non-inverting CCII output being connected to the second CDN analog input;
the filter stage further including a second DCCF having an input, a digital control input $\alpha_a$, and an inverting output connected to a current source $a_i$, output of the second CDN being connected to the second DCCF input;
a cascade connection of said filter stages, for all stages except a last stage, said passive circuit being formed by a capacitor connected between the y input of the stage and ground, and a resistor connected between the x input of the stage and ground;
except for the last stage, said first DCCF outputs of the stages being connected to each other in a feedback loop, said feedback loop connecting the current source $b_i$ and terminating at the x input of the last stage, the x input accepting an input signal $i_s$;
said second DCCF outputs of the stages being connected to each other in a feedforward configuration, the first stage delivering an output signal $i_{out}$; and
wherein the reconfigurable Nth-order filter is defined by a pair of transfer functions characterized by the equations,

$$\frac{i_m(s)}{i_s(s)} = \frac{s^m \beta_{am}\alpha_{am} s^i \Pi_{i=m}^{n-1} \frac{1}{C_{i+1}R_i}}{s^n + \Sigma_{i=0}^{n-1}\beta_{bi}\alpha_{bi}s^i \Pi_{j=i}^{n-1}\frac{1}{C_{j+1}R_j}}, \text{ and}$$

$$\frac{i_n(s)}{i_s(s)} = \frac{s^n \beta_{an}\alpha_{an}}{s^n + \Sigma_{i=0}^{n-1}\beta_{bi}\alpha_{bi}s^i \Pi_{j=i}^{n-1}\frac{1}{C_{j+1}R_j}}.$$

2. The reconfigurable Nth-order filter according to claim 1, further comprising a low pass filter (LPF) configuration of said reconfigurable Nth-order filter, the LPF configuration being determined by settings of the digital control inputs, $\beta_b$, $\alpha_b$, $\beta_a$, $\alpha_a$.

3. The reconfigurable Nth-order filter according to claim 1, further comprising a high pass filter (HPF) configuration of said reconfigurable Nth-order filter, the HPF configuration being determined by settings of the digital control inputs $\beta_b$, $\alpha_b$, $\beta_a$, $\alpha_a$.

4. The reconfigurable Nth-order filter according to claim 1, further comprising a band pass filter (BPF) configuration of said reconfigurable Nth-order filter, the BPF configuration being determined by settings of the digital control inputs $\beta_b$, $\alpha_b$, $\beta_a$, $\alpha_a$.

5. The reconfigurable Nth-order filter according to claim 1, wherein the stages form a $4^{th}$-order filter.

6. The reconfigurable Nth-order filter according to claim 5, wherein:
each of the resistors is approximately 159 kΩ;
each of the capacitors is approximately 1 pF; and
wherein a nominal pole frequency ($f_o$) is approximately 1 MHz.

7. The reconfigurable Nth-order filter according to claim 6, wherein:
each CDN digital control input is eight bits; and
wherein β can be adjusted from 0 to 0.996 and α can be changed from 1.004 to 256.

8. The reconfigurable Nth-order filter according to claim 7, further comprising:
predetermined β and α digital control input settings wherein a response of the reconfigurable Nth-order filter provides a Butterworth lowpass response and a lowest pole frequency of approximately 250 kHz.

9. The reconfigurable Nth-order filter according to claim 7, further comprising:
predetermined β and α digital control input settings wherein a response of the reconfigurable Nth-order filter provides a Butterworth lowpass response and a lowest pole frequency of approximately 4 MHz.

10. The reconfigurable Nth-order filter according to claim 7, further comprising:
predetermined β and α digital control input settings wherein a response of the reconfigurable Nth-order filter provides a Butterworth lowpass response and a lowest pole frequency of approximately 1 MHz.

11. The reconfigurable Nth-order filter according to claim 7, further comprising:
predetermined β and α digital control input settings wherein a response of the reconfigurable Nth-order filter provides a Butterworth bandpass response and a lowest pole frequency of approximately 250 kHz.

12. The reconfigurable Nth-order filter according to claim 7, further comprising:
predetermined β and α digital control input settings wherein a response of the reconfigurable Nth-order filter provides a Butterworth bandpass response and a lowest pole frequency of approximately 4 MHz.

13. The reconfigurable Nth-order filter according to claim 7, further comprising:
   predetermined β and α digital control input settings wherein a response of the reconfigurable Nth-order filter provides a Butterworth bandpass response and a lowest pole frequency of approximately 1 MHz.

14. The reconfigurable Nth-order filter according to claim 7, further comprising:
   predetermined β and α digital control input settings wherein a response of the reconfigurable Nth-order filter provides a Butterworth highpass response and a lowest pole frequency of approximately 250 kHz.

15. The reconfigurable Nth-order filter according to claim 7, further comprising:
   predetermined β and α digital control input settings wherein a response of the reconfigurable Nth-order filter provides a Butterworth highpass response and a lowest pole frequency of approximately 4 MHz.

16. The reconfigurable Nth-order filter according to claim 7, further comprising:
   predetermined β and α digital control input settings wherein a response of the reconfigurable Nth-order filter provides a Butterworth highpass response and a lowest pole frequency of approximately 1 MHz.

* * * * *